(12) United States Patent
Jobetto

(10) Patent No.: US 7,352,054 B2
(45) Date of Patent: Apr. 1, 2008

(54) SEMICONDUCTOR DEVICE HAVING CONDUCTING PORTION OF UPPER AND LOWER CONDUCTIVE LAYERS

(75) Inventor: Hiroyasu Jobetto, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 203 days.

(21) Appl. No.: 11/040,593

(22) Filed: Jan. 21, 2005

(65) Prior Publication Data

US 2005/0161799 A1 Jul. 28, 2005

(30) Foreign Application Priority Data

Jan. 27, 2004 (JP) ............................ 2004-018537

(51) Int. Cl.
| | | |
|---|---|---|
| *H01L 29/94* | (2006.01) | |
| *H01L 23/485* | (2006.01) | |
| *H01L 25/04* | (2006.01) | |
| *H01L 23/12* | (2006.01) | |
| *H01L 23/48* | (2006.01) | |

(52) U.S. Cl. ............................ 257/673; 257/E23.069; 257/E25.125; 257/E23.178; 257/E23.021; 257/E21.512; 257/E23.135; 257/734; 257/737; 257/738; 257/696; 257/666; 257/690; 257/691; 257/693; 257/692; 257/698

(58) Field of Classification Search ........ 257/E23.178, 257/E23.069, E25.125, E23.021, E21.512, 257/E23.135, 673, 734, 737, 738, 684, 696, 257/690–693, 666, 698, 773, 774; 361/764, 361/761

See application file for complete search history.

(56) References Cited

U.S. PATENT DOCUMENTS

| | | | | |
|---|---|---|---|---|
| 7,045,899 B2* | 5/2006 | Yamane et al. | ............. | 257/777 |
| 2001/0010627 A1* | 8/2001 | Akagawa | ..................... | 361/761 |
| 2004/0245614 A1* | 12/2004 | Jobetto | ........................ | 257/678 |
| 2004/0262716 A1* | 12/2004 | Aoki | ........................... | 257/619 |
| 2005/0009329 A1* | 1/2005 | Tanida et al. | ............... | 438/667 |
| 2005/0051886 A1* | 3/2005 | Mihara et al. | ............. | 257/690 |
| 2005/0062147 A1* | 3/2005 | Wakisaka et al. | ........... | 257/712 |
| 2005/0161803 A1* | 7/2005 | Mihara | ........................ | 257/698 |
| 2005/0161823 A1* | 7/2005 | Jobetto et al. | ............. | 257/758 |
| 2005/0218451 A1* | 10/2005 | Jobetto | ........................ | 257/347 |
| 2005/0269698 A1* | 12/2005 | Okada et al. | ............... | 257/737 |
| 2006/0022338 A1* | 2/2006 | Meyer et al. | ............... | 257/737 |

(Continued)

FOREIGN PATENT DOCUMENTS

JP    11-233678 A    8/1999

(Continued)

*Primary Examiner*—Alexander Oscar Williams
(74) *Attorney, Agent, or Firm*—Frishauf, Holtz, Goodman & Chick, P.C.

(57) ABSTRACT

A semiconductor device includes a base plate, at least one first conductive layer carried by the base plate, and a semiconductor constructing body formed on or above the base plate, and having a semiconductor substrate and a plurality of external connecting electrodes formed on the semiconductor substrate. An insulating layer is formed on the base plate around the semiconductor constructing body. A plurality of second conductive layers are formed on the insulating layer and electrically connected to the external connecting electrodes of the semiconductor constructing body. A vertical conducting portion is formed on side surfaces of the insulating film and base plate, and electrically connects the first conductive layer and at least one of the second conductive layers.

10 Claims, 18 Drawing Sheets

U.S. PATENT DOCUMENTS

2006/0125082 A1* 6/2006 Wakabayashi et al. ...... 257/698
2006/0244136 A1* 11/2006 Mihara ....................... 257/734

FOREIGN PATENT DOCUMENTS

| JP | 2002-93942 A | 3/2002 |
| JP | 2002-110951 A | 4/2002 |
| JP | 2003-298005 A | 10/2003 |
| JP | 2004-221417 * | 8/2004 |

* cited by examiner

SEMICONDUCTOR DEVICE HAVING CONDUCTING PORTION OF UPPER AND LOWER CONDUCTIVE LAYERS

CROSS-REFERENCE TO RELATED APPLICATIONS

This application is based upon and claims the benefit of priority from prior Japanese Patent Application No. 2004-018537, filed Jan. 27, 2004, the entire contents of which are incorporated herein by reference.

BACKGROUND OF THE INVENTION

1. Field of the Invention

The present invention relates to a semiconductor device technique and, more particularly, to a semiconductor device having a conducting portion of upper and lower conductive layers and a method of fabricating the same.

2. Description of the Related Art

The conventional semiconductor device disclosed in Jpn. Pat. Appln. KOKAI Publication No. 2003-298005 includes solder balls as connecting terminals for external connection outside the size of a silicon substrate. Therefore, this semiconductor device has a structure in which a silicon substrate having a plurality of connecting pads on its upper surface is formed on the upper surface of a base plate, an insulating layer is formed on the upper surface of the base plate around the silicon substrate, an upper insulating film is formed on the upper surfaces of the silicon substrate and insulating layer, upper interconnections are formed on the upper surface of the upper insulating film and electrically connected to the connecting pads of the silicon substrate, portions except for connecting pad portions of the upper interconnections are covered with an overcoat film, and solder balls are formed on the connecting pad portions of the upper interconnections.

In this conventional semiconductor device, the upper interconnections are formed only above the silicon substrate and on insulating layer. To effectively use the space, it is also possible to form interconnections on the upper or lower surface of the base plate, and connect a portion of the interconnections to a portion of the upper interconnections via a vertical conducting portion extended in a through hole formed in the insulating layer and base plate. In this structure, however, the insulating layer and base plate are present outside the vertical conducting portion in the through hole formed in the insulating layer and base plate. This unnecessarily increases the size of the semiconductor device.

BRIEF SUMMARY OF THE INVENTION

It is, therefore, an object of the present invention to provide a semiconductor device which can be downsized even when a vertical conducting portion is formed, and a method of fabricating the same.

According to an aspect of the present invention, there is provided a semiconductor device comprising:

a base plate;

at least one first conductive layer carried by the base plate;

a semiconductor constructing body formed on or above the base plate, and having a semiconductor substrate and a plurality of external connecting electrodes formed on the semiconductor substrate;

an insulating layer formed on the base plate around the semiconductor constructing body;

a plurality of second conductive layers formed on the insulating layer and electrically connected to the external connecting electrodes of the semiconductor constructing body; and a vertical conducting portion which is formed on side surfaces of the insulating film and base plate, and electrically connects the first conductive layer and at least one of the second conductive layers.

According to another aspect of the present invention, there is provided a semiconductor device fabrication method comprising:

arranging, on one side of a base plate carrying at least one a first conductive layer, a plurality of semiconductor constructing bodies each having a semiconductor substrate and a plurality of external connecting electrodes formed on the semiconductor substrate, such that said plurality of semiconductor constructing bodies are spaced apart from each other;

forming an insulating layer on said one side of the base plate around each semiconductor constructing body;

forming a plurality of second conductive layers each having at least one layer on the semiconductor constructing body and insulating layer, such that said plurality of second conductive layers are electrically connected to the external connecting terminals of the semiconductor constructing body;

defining a cut line on the insulating layer of the base plate, the cut line defining a region such that at least one semiconductor constructing body is included in the region;

forming a vertical conducting portion which includes the cut line to extend to the cut line, and electrically connects the first conductive layer and at least one of the second conductive layers; and cutting the insulating layer, base plate, and vertical conducting portion along the cut line, thereby obtaining a plurality of semiconductor devices each having a portion of the vertical conducting portion on a side surface.

In this technique, the vertical conducting portion is formed on the side surface of the insulating layer formed on the base plate around the semiconductor constructing body, and on the side surface of the base plate. Therefore, neither the insulating layer nor the base plate is present outside the vertical conducting portion, so the semiconductor device can be downsized even when the vertical conducting portion is formed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention and, together with the general description given above and the detailed description of the embodiments given below, serve to explain the principles of the invention.

DETAILED DESCRIPTION OF THE INVENTION

First Embodiment

Figure 1:
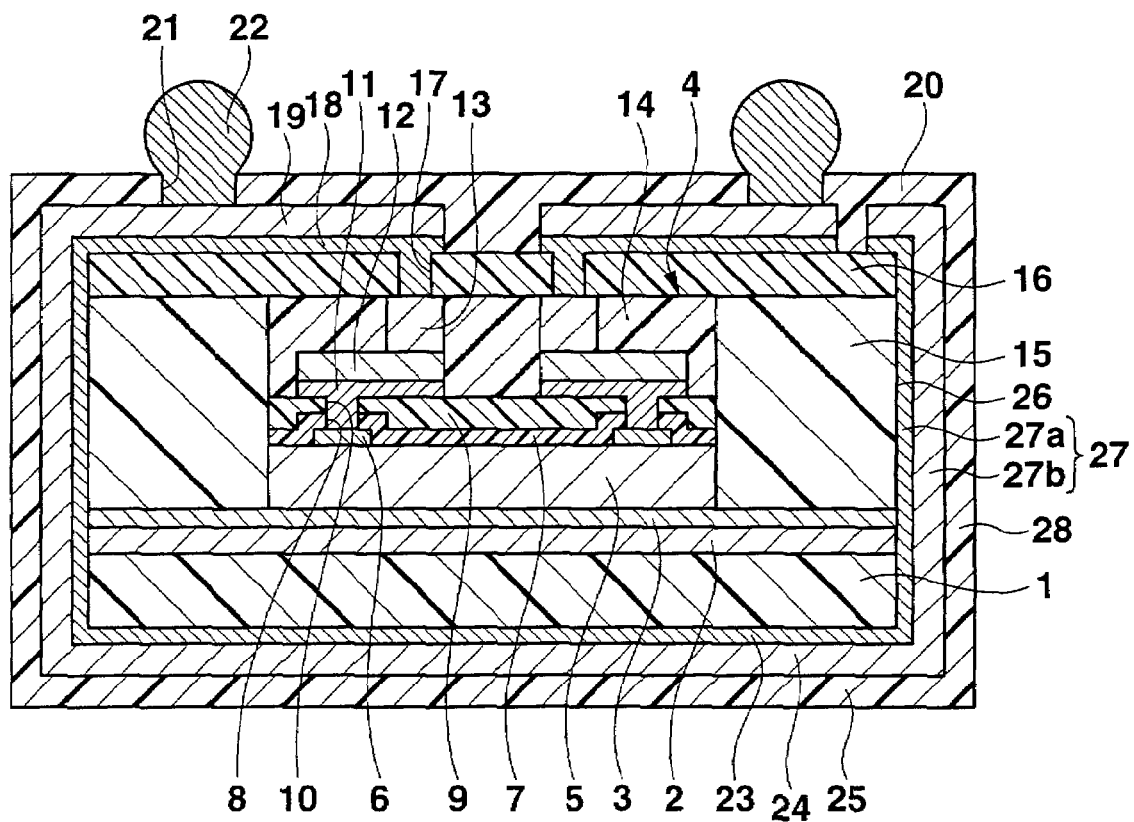
FIG. 1 is a sectional view of a semiconductor device according to the first embodiment of the present invention.

FIG. 1 is a sectional view of a semiconductor device according to the first embodiment of the present invention. This semiconductor device includes a base plate 1 having a square planar shape and made of, e.g., a glass fabric base epoxy resin. A ground layer (first conductive layer) 2 having a solid pattern and made of a copper foil is formed on the entire upper surface of the base plate 1. A conductive adhesive layer 3 is formed on the entire upper surface of the ground layer 2.

The lower surface of a semiconductor constructing body 4 having a square planar shape and a size smaller to a certain degree than the size of the base plate 1 is adhered to a predetermined portion on the upper surface of the conductive adhesive layer 3. The semiconductor constructing body 4 has interconnections 12, columnar electrodes 13, and a sealing film 14 (all of which will be explained later), and is generally called a CSP (Chip Size Package). Since the individual semiconductor constructing bodies 4 are obtained by dicing after the interconnections 12, columnar electrodes 13, and sealing film 14 are formed on a silicon wafer as will be described later, the semiconductor constructing body 4 is also particularly called a wafer level CSP (W-CSP). The structure of the semiconductor constructing body 4 will be explained below.

The semiconductor constructing body 4 includes a silicon substrate (semiconductor substrate) 5 having a square planar shape. The lower surface of the silicon substrate 5 is adhered to the ground layer 2 via the conductive adhesive layer 3. An integrated circuit (not shown) having a predetermined function is formed on the upper surface of the silicon substrate 5. A plurality of connecting pads 6 made of, e.g., an aluminum-based metal are formed on the periphery of the upper surface and electrically connected to the integrated circuit. An insulating film 7 made of silicon oxide or the like is formed on the upper surface of the silicon substrate 5 except for central portions of the connecting pads 6. These central portions of the connecting pads 6 are exposed through holes 8 formed in the insulating film 7.

A protective film 9 made of, e.g., an epoxy-based resin or polyimide-based resin is formed on the upper surface of the insulating film 7. Holes 10 are formed in those portions of the protective film 9, which correspond to the holes 8 in the insulating film 7. A plurality of metal undercoatings 11 made of copper or the like are formed on the upper surface of the protective film 9. The interconnections 12 made of copper are respectively formed on the entire upper surface of the metal undercoatings 11. One end portion of each the metal undercoating 11 is electrically connected to the connecting pad 6 through the holes 8 and 10.

The columnar electrodes (external connecting electrodes) 13 made of copper are respectively formed on the upper surfaces of connecting pad portions of the interconnections 12. The sealing film 14 made of, e.g., an epoxy-based resin or polyimide-based resin is formed on the upper surface of the protective film 9 and the interconnections 12, such that the upper surface of the sealing film 14 is leveled with the upper surfaces of the columnar electrodes 13. As described above, the semiconductor constructing body 4 called a W-CSP includes the silicon substrate 5, connecting pads 6, and insulating film 7, and also includes the protective film 9, interconnections 12, columnar electrodes 13, and sealing film 14.

A square frame-like insulating layer 15 is formed on the upper surface of the base plate 1 around the semiconductor constructing body 4, such that the upper surface of the insulating layer 15 is substantially leveled with the upper surface of the semiconductor constructing body 4. The insulating layer 15 is made of a thermosetting resin such as an epoxy-based resin or polyimide-based resin, or a material obtained by mixing, in a thermosetting resin like this, a reinforcing material such as glass fibers or a silica filler.

On the upper surfaces of the semiconductor constructing body 4 and insulating layer 15, an upper insulating film 16 is formed to have a flat upper surface. The upper insulating film 16 is usually called a buildup material used as a buildup substrate, and formed by, e.g., mixing a reinforcing material such as a silica filler in a thermosetting resin such as an epoxy-based resin.

Holes 17 are formed in those portions of the upper insulating film 16, which correspond to the central portions of the upper surfaces of the columnar electrodes 13. Upper metal undercoatings 18 made of copper or the like are formed on the upper surface of the upper insulating film 16.

Upper interconnections (second conductive layers) 19 made of copper are respectively formed on the entire upper surfaces of the upper metal undercoatings 18. One end portion of each metal undercoating 18 is electrically connected to the upper surface of the columnar electrode 13 through the hole 17 in the upper insulating film 16.

An upper overcoat film 20 made of a solder resist or the like is formed on the upper surface of the upper insulating film 16 and the upper interconnections 19. Holes 21 are formed in those portions of the upper overcoat film 20, which correspond to the connecting pad portions of the upper interconnections 19. Solder balls 22 are formed in and above the holes 21 and electrically and mechanically connected to the connecting pad portions of the upper interconnections 19. The solder balls 22 are preferably arranged in a matrix on the upper overcoat film 20.

A lower metal undercoating 23 having a solid pattern and made of copper or the like is formed on the entire lower surface of the base plate 1. A lower interconnection (first conductive layer) 24 made of copper is formed on the entire lower surface of the lower metal undercoating 23. The lower interconnection 24 is a solid pattern formed on the entire lower surface of the lower metal undercoating 23, and forms a lower ground layer. A lower overcoat film 25 made of a solder resist or the like is formed on the entire lower surface of the lower interconnection 24.

Figure 2:
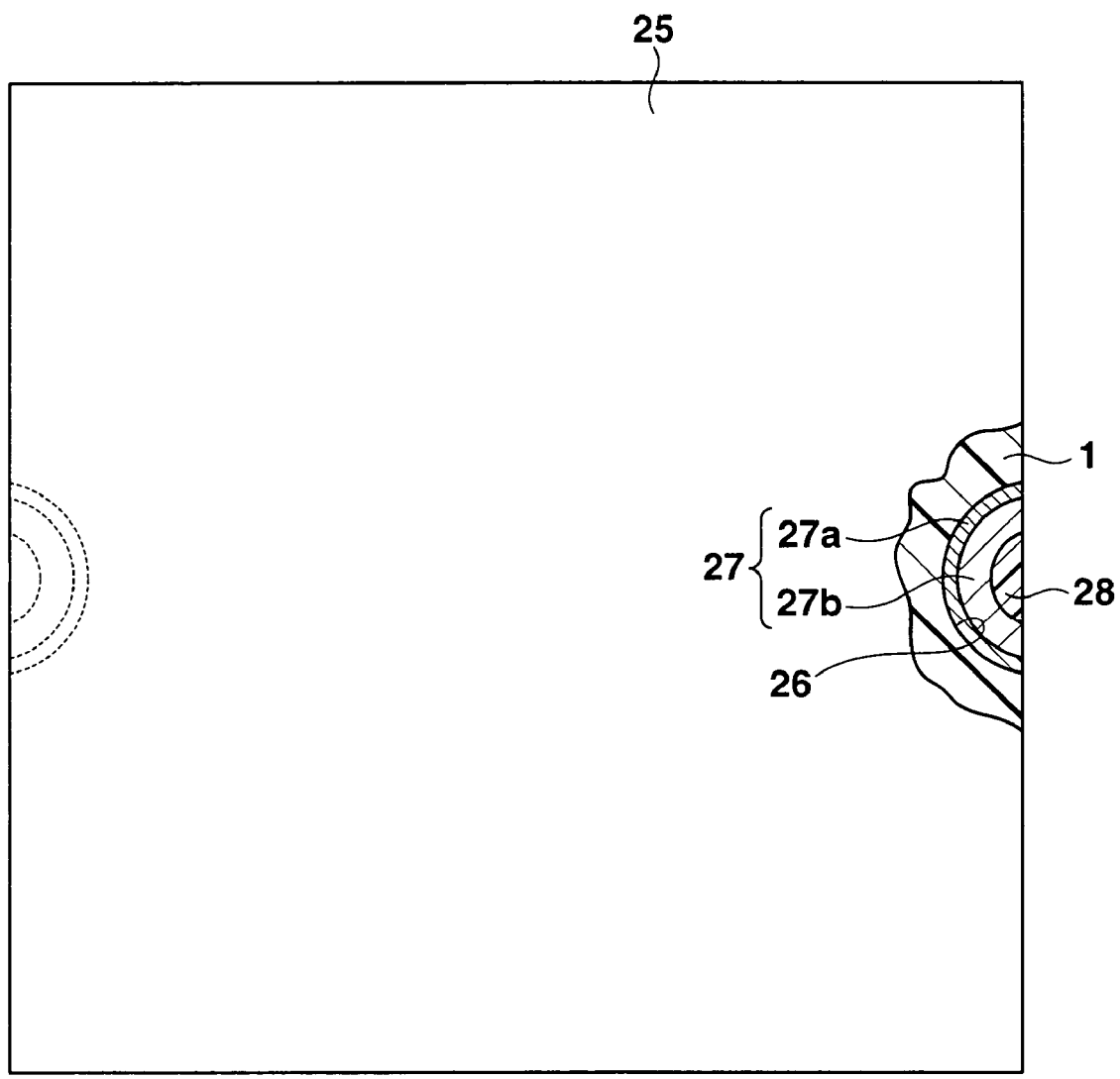
FIG. 2 is a bottom view from which a portion of the semiconductor device shown in FIG. 1 is cut away.

FIG. 2 is a bottom view from which a portion of the semiconductor device shown in FIG. 1 is cut away. Grooves 26 having a substantially semi-circular planar shape are formed in a plurality of predetermined portions, two portions in FIG. 2, of the side surfaces of the base plate 1, ground layer 2, conductive adhesive layer 3, insulating layer 15, and upper insulating film 16. A vertical conducting layer constructed by a metal undercoating 27a made of copper or the like, and a copper layer 27b is formed in each groove 26. That is, a vertical conducting portion 27 is formed by the groove 26, and the vertical conducting layer made up of the metal undercoating 27a and copper layer 27b. A side-surface insulating film 28 made of a solder resist or the like is formed in the groove 26 and thus the copper layer 27b of each vertical conducting portion 27.

The vertical conducting portions 27 are in direct contact with and electrically connected to the ground layer 2, portions of the upper interconnections 19 including the upper metal undercoating 18, and the lower interconnection 24 including the lower metal undercoating 23. That is, the ground layer 2 and the lower interconnection 24 forming the lower ground layer are electrically connected to the solder balls 22 for grounding and to the columnar electrodes 13 for grounding of the semiconductor constructing body 4 via the vertical conducting portions 27 and portions of the upper interconnections 19.

In this semiconductor device as described above, the grooves 26 having a substantially semi-circular shape in a plane (horizontal section) are formed in the side surfaces of the base plate 1, insulating layer 15, and upper insulating film 16, and the vertical conducting portions 27 for electrically connecting the ground layer 2 and portions of the upper interconnections 19 are formed in the grooves 26. When compared to a structure in which, for example, vertical conducting portions are formed in through holes formed in the base plate 1, insulating layer 15, upper insulating film 16, and the like, none of the base plate 1, insulating layer 15, upper insulating film 16, and the like is present outside the vertical conducting portions 27, so the semiconductor device can be downsized accordingly.

The size of the base plate 1 is made larger to some extent than that of the semiconductor constructing body 4, in order to make the size of the formation region of the solder balls 22 larger to a certain degree than that of the semiconductor constructing body 4 in accordance with the increase in number of the connecting pads 6 on the silicon substrate 5, thereby making the size and pitch of the connecting pad portions (the portions in the holes 21 of the upper overcoat film 20) of the upper interconnections 19 larger than those of the columnar electrodes 13.

Accordingly, those connecting pad portions of the upper interconnections 19, which are arranged in a matrix are formed not only in a region corresponding to the semiconductor constructing body 4, but also in a region corresponding to the insulating layer 15 formed outside the side surfaces of the semiconductor constructing body 4. That is, of the solder balls 22 which are arranged in a matrix, at least outermost solder balls 22 are formed in a periphery positioned outside the semiconductor constructing body 4.

Figure 3:
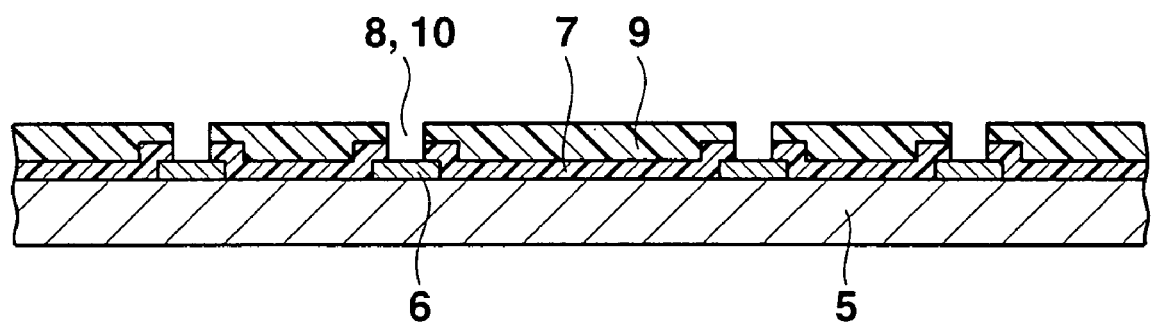
FIG. 3 is a sectional view of an assembly initially prepared in the fabrication of the semiconductor constructing body shown in FIGS. 1 and 2.

An example of a method of fabricating this semiconductor device will be described below. First, an example of the fabrication method of the semiconductor constructing body 4 will be explained. In this method, an assembly as shown in FIG. 3 is first prepared. In this assembly, connecting pads 6 made of, e.g., an aluminum-based metal, an insulating film 7 made of, e.g., silicon oxide, and a protective film 9 made of, e.g., an epoxy-based resin or polyimide-based resin are formed on an upper side of a wafer-like silicon substrate (semiconductor substrate) 5. Central portions of the connecting pads 6 are exposed through holes 8 and 10 respectively formed in the insulating film 7 and protective film 9. In the wafer-like silicon substrate 5 having this structure, an integrated circuit having a predetermined function is formed in a region where each semiconductor constructing body is to be formed, and each connecting pad 6 is electrically connected to the integrated circuit formed in the corresponding region.

Figure 4:
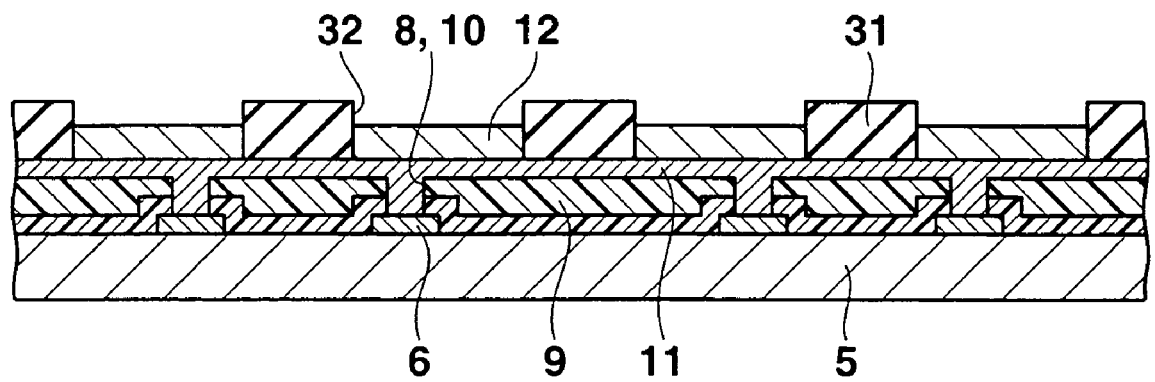
FIG. 4 is a sectional view of the assembly in a step following FIG. 3.

Then, as shown in FIG. 4, a metal undercoating 11 is formed on the entire upper surface of the protective film 9 and the upper surfaces of the connecting pads 6 exposed through the holes 8 and 10. The metal undercoating 11 can be any of a copper layer formed by electroless plating, a copper layer formed by sputtering, and a combination of a thin film of titanium or the like formed by sputtering and a copper layer formed on this thin film by sputtering.

A plating resist film 31 is formed by patterning on the upper surface of the metal undercoating 11. In this case, holes 32 are formed in those portions of the plating resist film 31, which correspond to regions where interconnections 12 are to be formed. Electroplating of copper is then performed by using the metal undercoating 11 as a plating current path, thereby forming interconnections 12 on the upper surface of the metal undercoating 11 in the holes 32 of the plating resist film 31. After that, the plating resist film 31 is removed.

Figure 5:
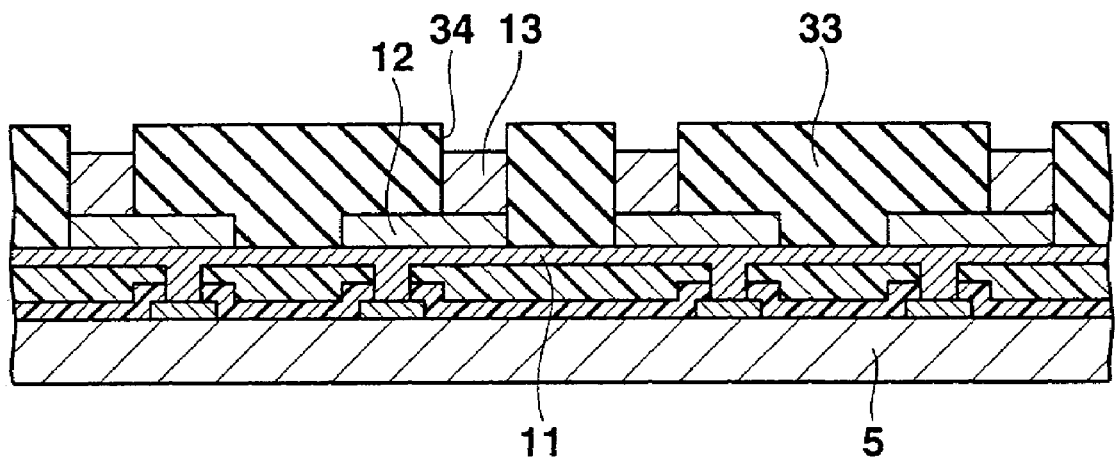
FIG. 5 is a sectional view of the assembly in a step following FIG. 4.
Figure 6:
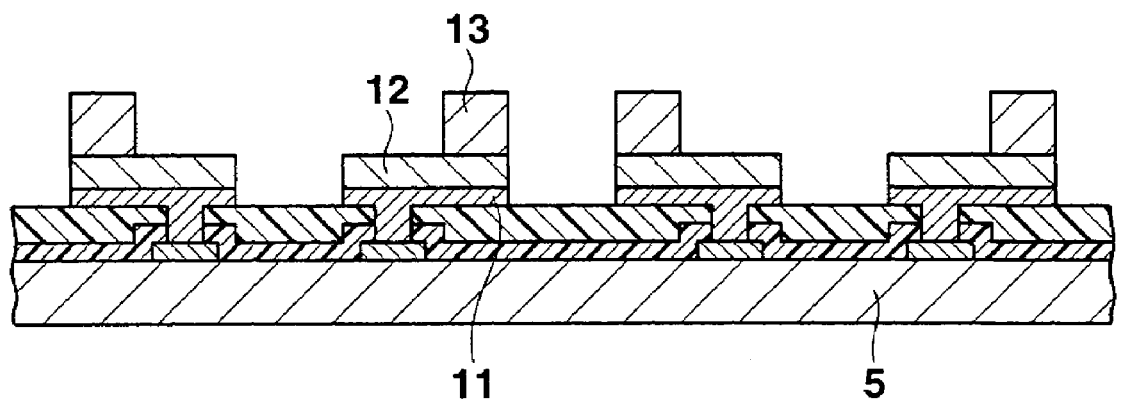
FIG. 6 is a sectional view of the assembly in a step following FIG. 5.

As shown in FIG. 5, a plating resist film 33 is formed by patterning on the upper surface of the metal undercoating 11 including the interconnections 12. In this case, holes 34 are formed in those portions of the plating resist film 33, which correspond to regions where columnar electrodes 13 are to be formed. Electroplating of copper is then performed by using the metal undercoating 11 as a plating current path, thereby forming columnar electrodes 13 on the upper surfaces of connecting pad portions of the interconnections 12 in the holes 34 of the plating resist film 33. After that, the plating resist film 33 is removed, and unnecessary portions of the metal undercoating 11 are etched away by using the interconnections 12 as masks. Consequently, as shown in FIG. 6, the metal undercoating 11 remains only below the interconnections 12.

Figure 7:
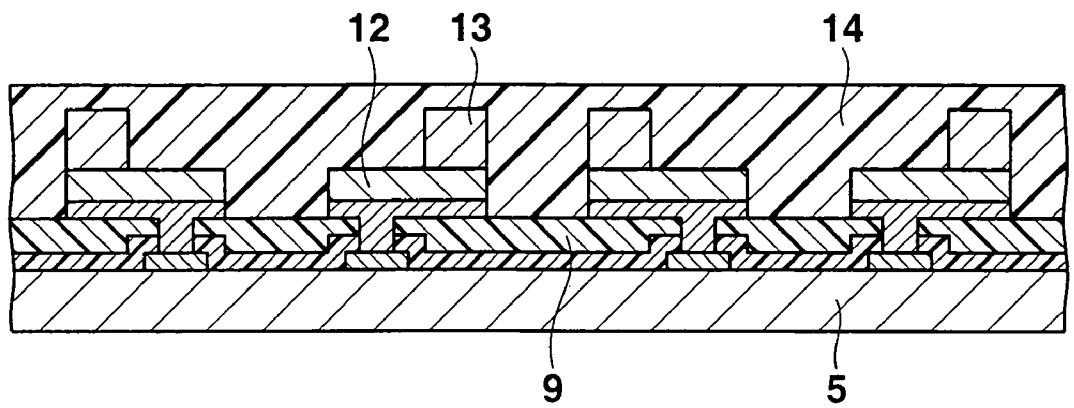
FIG. 7 is a sectional view of the assembly in a step following FIG. 6.

As shown in FIG. 7, a sealing film 14 made of, e.g., an epoxy-based resin or polyimide-based resin is formed on the entire upper surfaces of the protective film 9, the columnar electrodes 13 and interconnections 12 by, e.g., screen printing, spin coating, or die coating, such that the thickness of the sealing film 14 is larger than the height of the columnar electrodes 13. In this state, therefore, the upper surfaces of the columnar electrodes 13 are covered with the sealing film 14.

Figure 8:
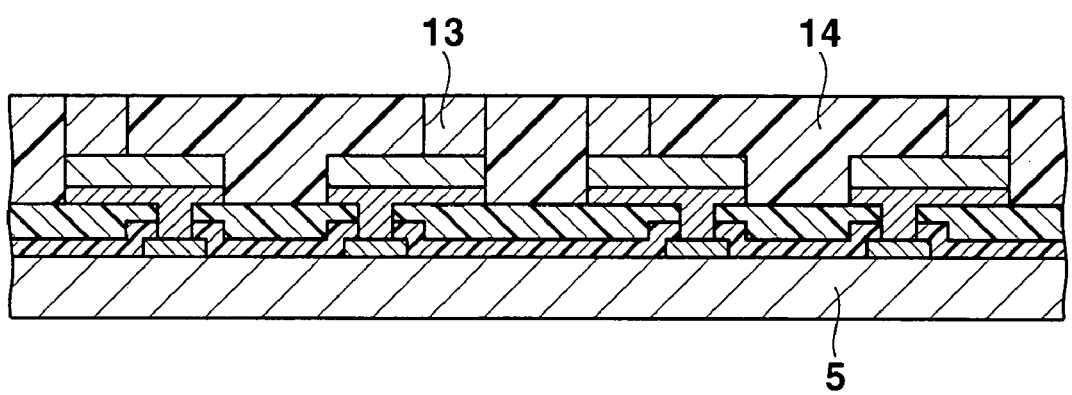
FIG. 8 is a sectional view of the assembly in a step following FIG. 7.

As shown in FIG. 8, the sealing film 14 and the upper surfaces of the columnar electrodes 13 are properly polished to expose the upper surfaces of the columnar electrodes 13, and planarize the upper surface of the sealing film 14 including those exposed upper surfaces of the columnar electrodes 13. The upper surfaces of the columnar electrodes 13 are thus properly polished in order to make the heights of the columnar electrodes 13 uniform by eliminating variations in height of the columnar electrodes 13 formed by electroplating.

Figure 9:
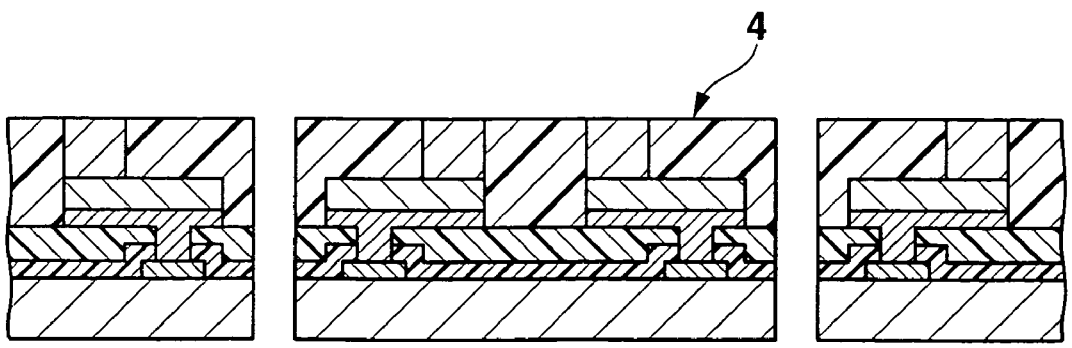
FIG. 9 is a sectional view of the assembly in a step following FIG. 8.

Then, the lower surface of the silicon substrate 5 is adhered to a dicing tape (not shown), and removed from the dicing tape after a dicing step shown in FIG. 9 is performed. Consequently, a plurality of semiconductor constructing bodies 4, one of which is shown in FIG. 1 are obtained.

Figure 10:
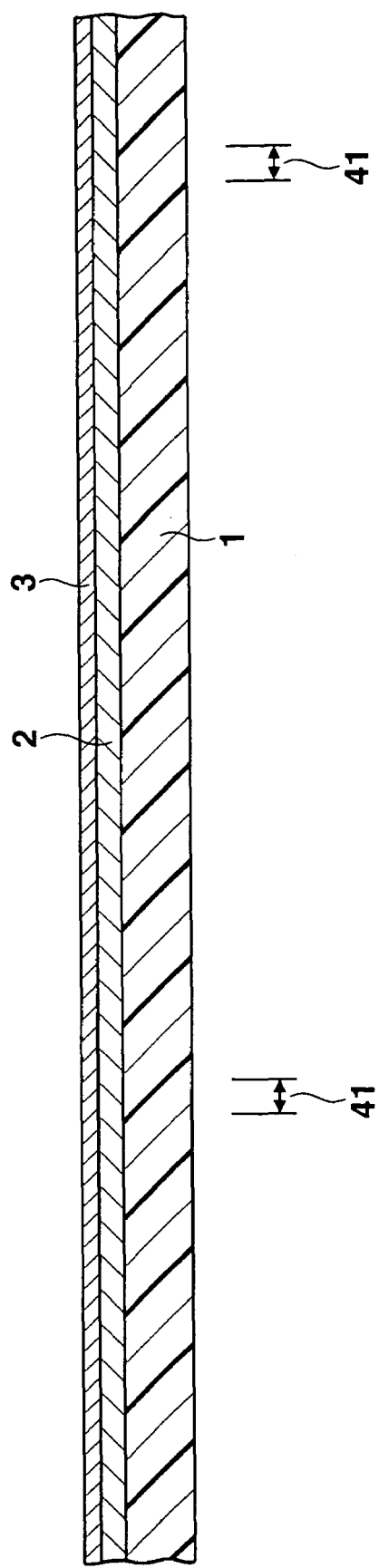
FIG. 10 is a sectional view of the assembly in a step following FIG. 9.

An example of a method of fabricating the semiconductor device shown in FIG. 1 by using the semiconductor constructing body 4 thus obtained will be described below. First, a base plate 1 as shown in FIG. 10 is prepared. The base plate 1 has a size capable of forming a plurality of base plates 1, one of which is shown in FIG. 1, and has a square planar shape, although the shape is not particularly limited. In this case, a ground layer 2 having a solid pattern and made of a copper foil is formed on the entire upper surface of the base plate 1, and a conductive adhesive layer 3 is formed on the entire upper surface of the ground layer 2. Referring to FIG. 10, regions indicated by reference numeral 41 correspond to dicing lines (cut lines).

Figure 11:
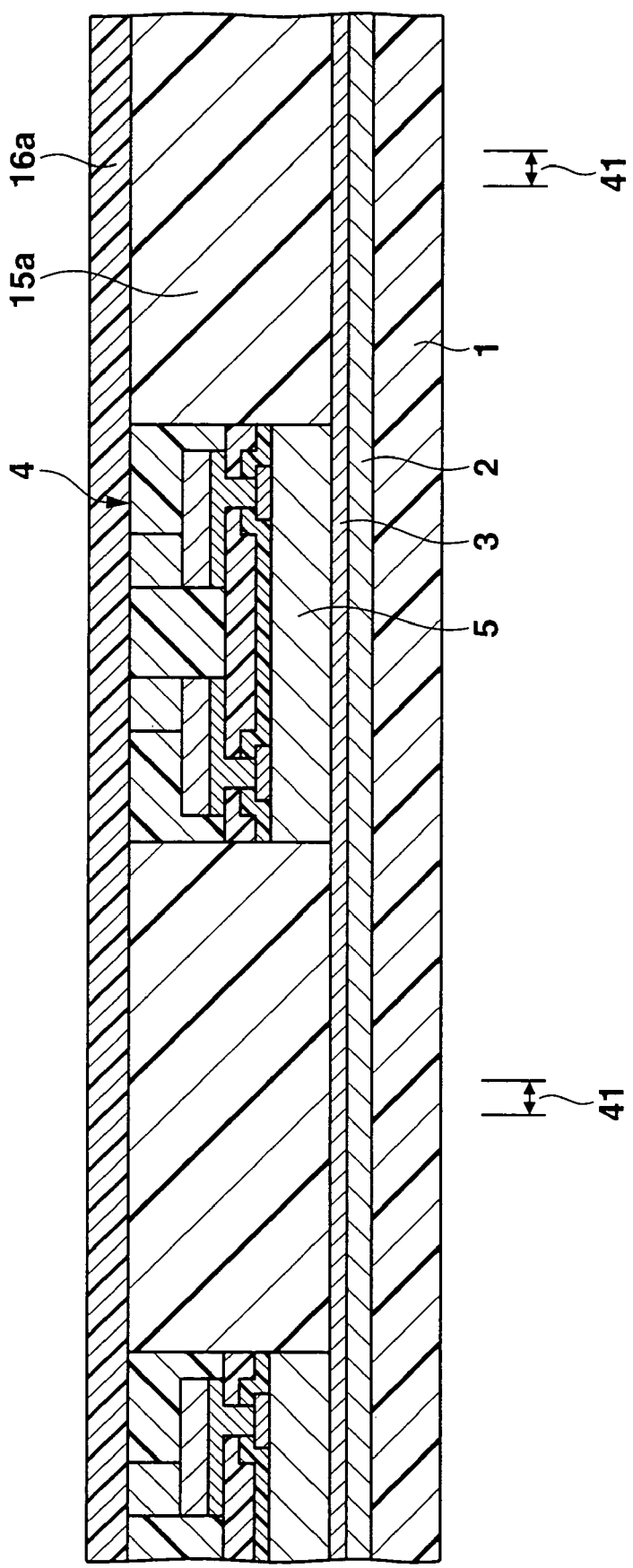
FIG. 11 is a sectional view of the assembly in a step following FIG. 10.

As shown in FIG. 11, the lower surfaces of the silicon substrates 5 of the semiconductor constructing bodies 4 are adhered to a plurality of predetermined portions on the upper surface of the conductive adhesive layer 3. Since the individual semiconductor constructing bodies 4 are obtained by cutting the base plate 1 from the dicing lines 41, each semiconductor constructing body 4 is fixed to a position where the cut position of the semiconductor constructing body 4 is aligned with the dicing line 41. Then, an insulating layer formation layer 15a is formed on the upper surface of the conductive adhesive layer 3 around the semiconductor constructing body 4 by, e.g., screen printing or spin coating. The insulating layer formation layer 15a is made of, e.g., a thermosetting resin such as an epoxy-based resin or polyimide-based resin, or a material obtained by mixing, in a thermosetting resin like this, a reinforcing material such as a silica filler.

Subsequently, an upper insulating film formation sheet 16a is placed on the upper surfaces of the semiconductor constructing bodies 4 and insulating layer formation layer 15a. The upper insulating film formation sheet 16a is preferably made of a sheet-like buildup material, although the material is not particularly limited. For example, this buildup material is obtained by mixing a silica filler in a thermosetting resin such as an epoxy-based resin, and semi-curing the thermosetting resin. Note that it is also possible to use, as the upper insulating film formation sheet 16a, a prepreg material obtained by impregnating glass fibers with a thermosetting resin such as an epoxy-based resin, and semi-curing the thermosetting resin into the form of a sheet, or a sheet made only of a thermosetting resin in which no silica filler is mixed.

Figure 12:
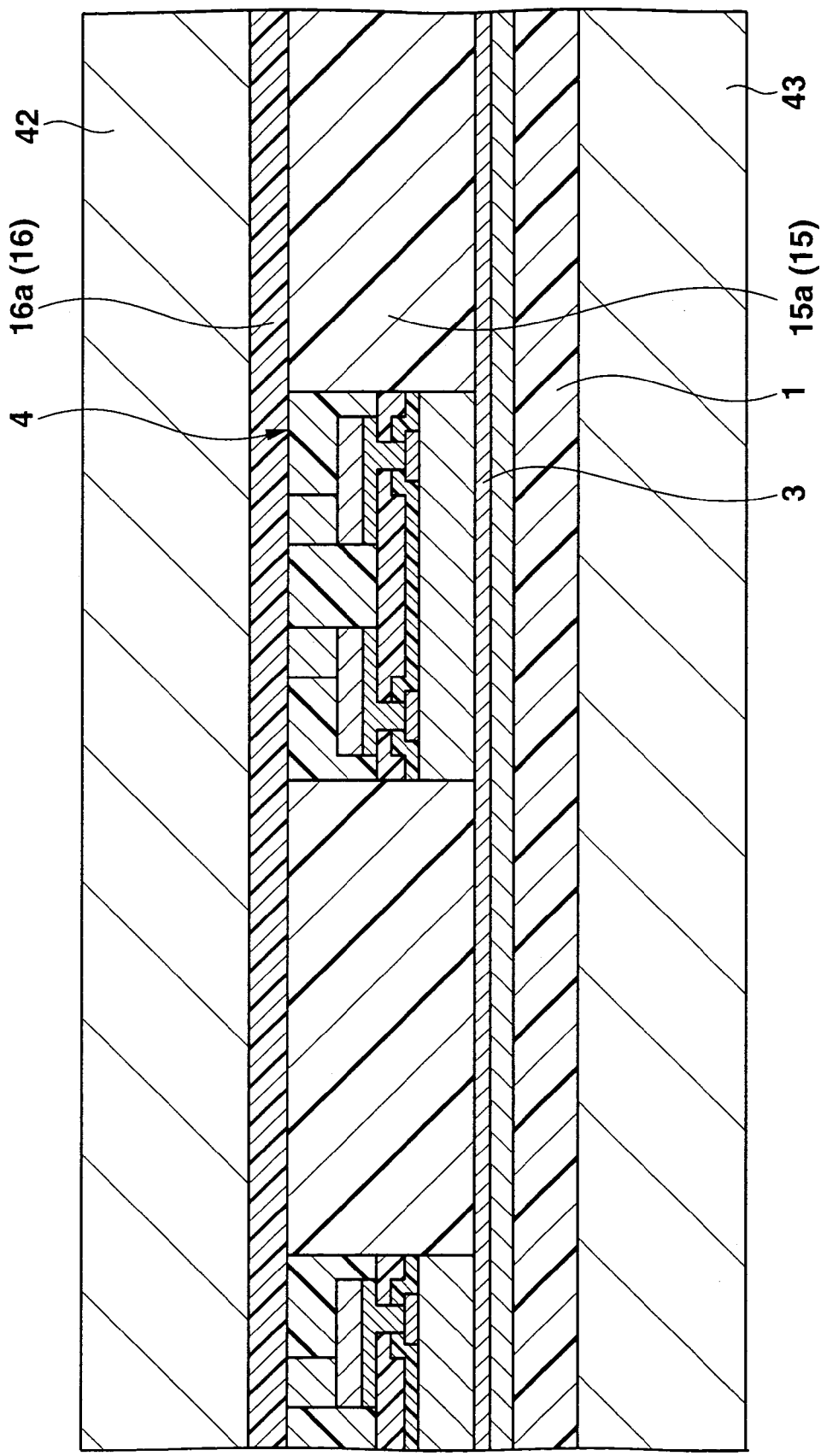
FIG. 12 is a sectional view of the assembly in a step following FIG. 11.

As shown in FIG. 12, a pair of heating/pressing plates 42 and 43 are used to heat and press, from above and below, the insulating layer formation layer 15a and upper insulating film formation sheet 16a. Consequently, an insulating layer 15 is formed on the upper surface of the conductive adhesive layer 3 around the semiconductor constructing body 4, and an upper insulating film 16 is formed on the upper surfaces of the semiconductor constructing bodies 4 and insulating layer 15. In this case, the upper surface of the upper insulating film 16 is a flat surface because it is pressed by the lower surface of the upper heating/pressing plate 42. Accordingly, no polishing step of planarizing the upper surface of the upper insulting film 16 is necessary.

Figure 13:
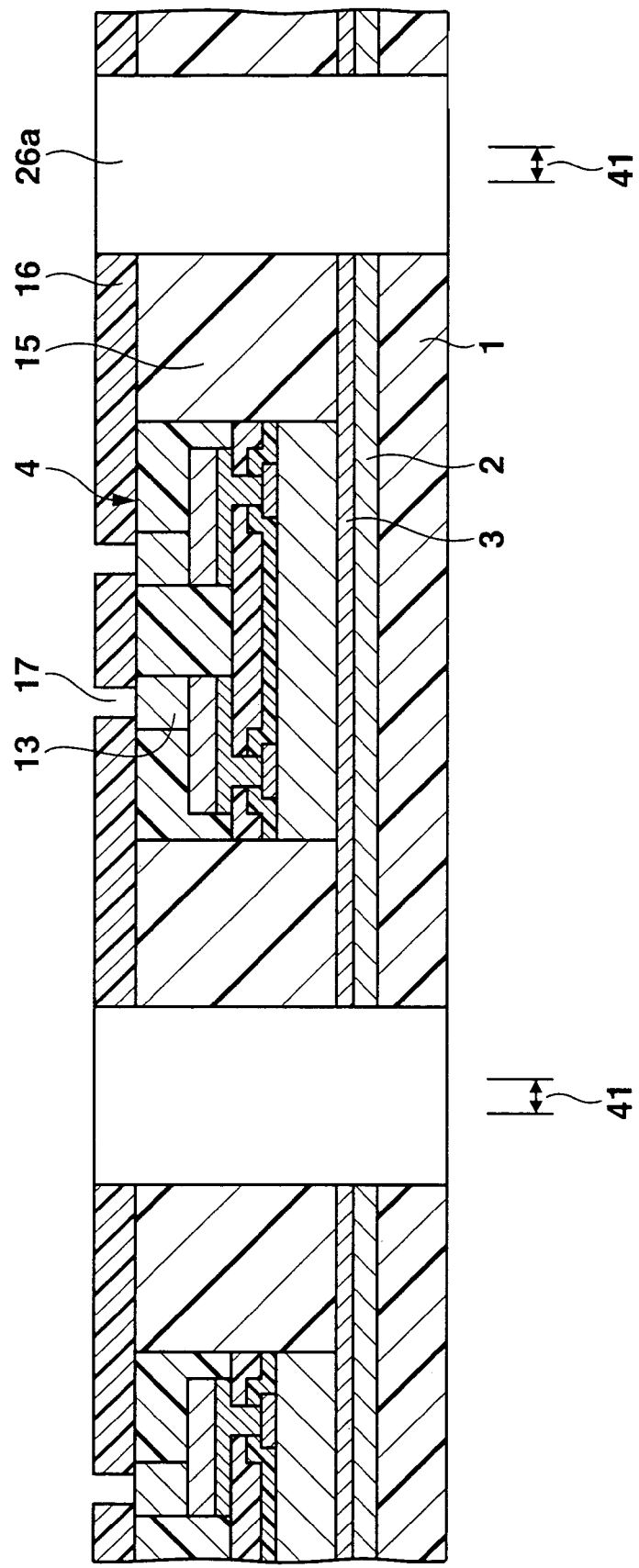
FIG. 13 is a sectional view of the assembly in a step following FIG. 12.
Figure 14:
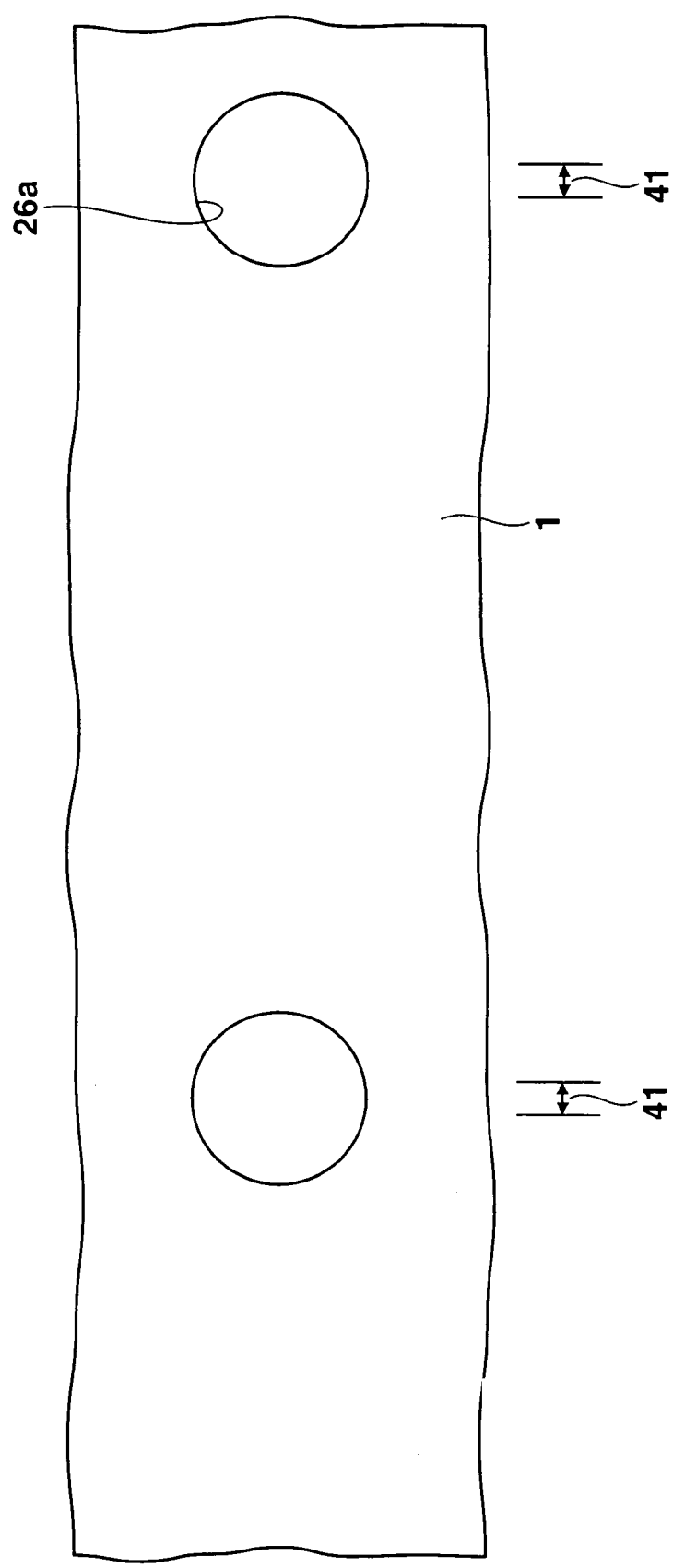
FIG. 14 is a bottom view of a portion of the assembly in the state shown in FIG. 13.

As shown in FIG. 13, after removing of the plates 42, 43, laser processing which applies a laser beam is used to form holes 17 in those portions of the upper insulating film 16, which correspond to the central portions of the upper surfaces of the columnar electrodes 13. Also, as shown in FIG. 14 which is a bottom view of a portion in the state shown in FIG. 13, a mechanical drill is used to form through holes 26a in regions corresponding to parts of the dicing lines 41 and their two sides. Each through hole 26a is vertically penetrates predetermined portions of the upper insulating film 16, insulating layer 15, conductive adhesive layer 3, ground layer 2, and base plate 1, and has a circular horizontal sectional shape whose diameter is larger to some extent than the width of the dicing line 41. That is, the through hole 26a extends to those regions of the base plate 1 and insulating layer 15, which include the dicing line 41 and its two side portions. Then, if necessary, epoxy smear and the like occurring in the holes 17 and the like are removed by a desmear process.

Figure 15:
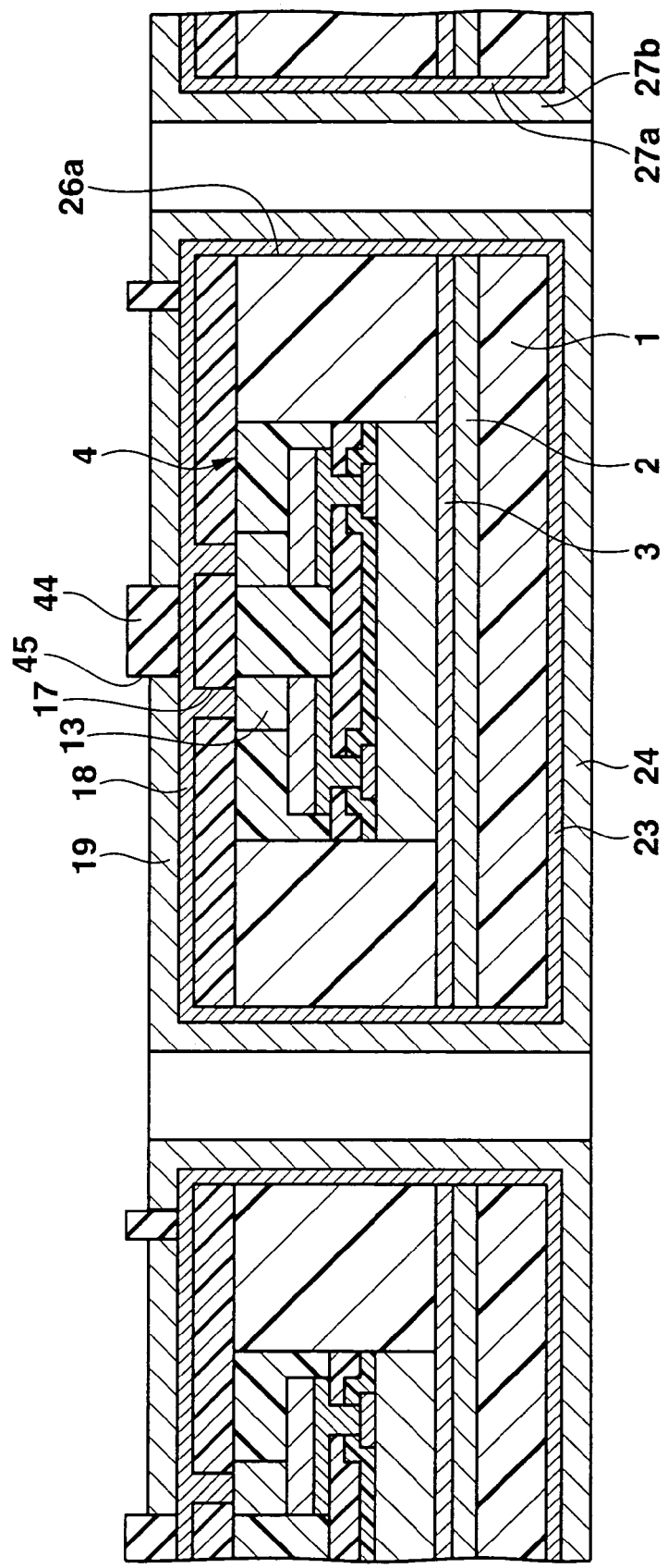
FIG. 15 is a sectional view of the assembly in a step following FIG. 13.

As shown in FIG. 15, an upper metal undercoating 18, lower metal undercoating 23, and metal undercoating 27a are formed by electroless plating or sputtering of copper on the entire upper surface of the upper insulating film 16 including the upper surfaces of the columnar electrodes 13 exposed through the holes 17, on the entire lower surface of the base plate 1, and on the inner surfaces of the through holes 26a. A plating resist film 44 is then formed by patterning on the upper surface of the upper metal undercoating 18. In this case, holes 45 are formed in those portions of the plating resist film 44, which correspond to formation regions of upper interconnections 19.

Figure 16:
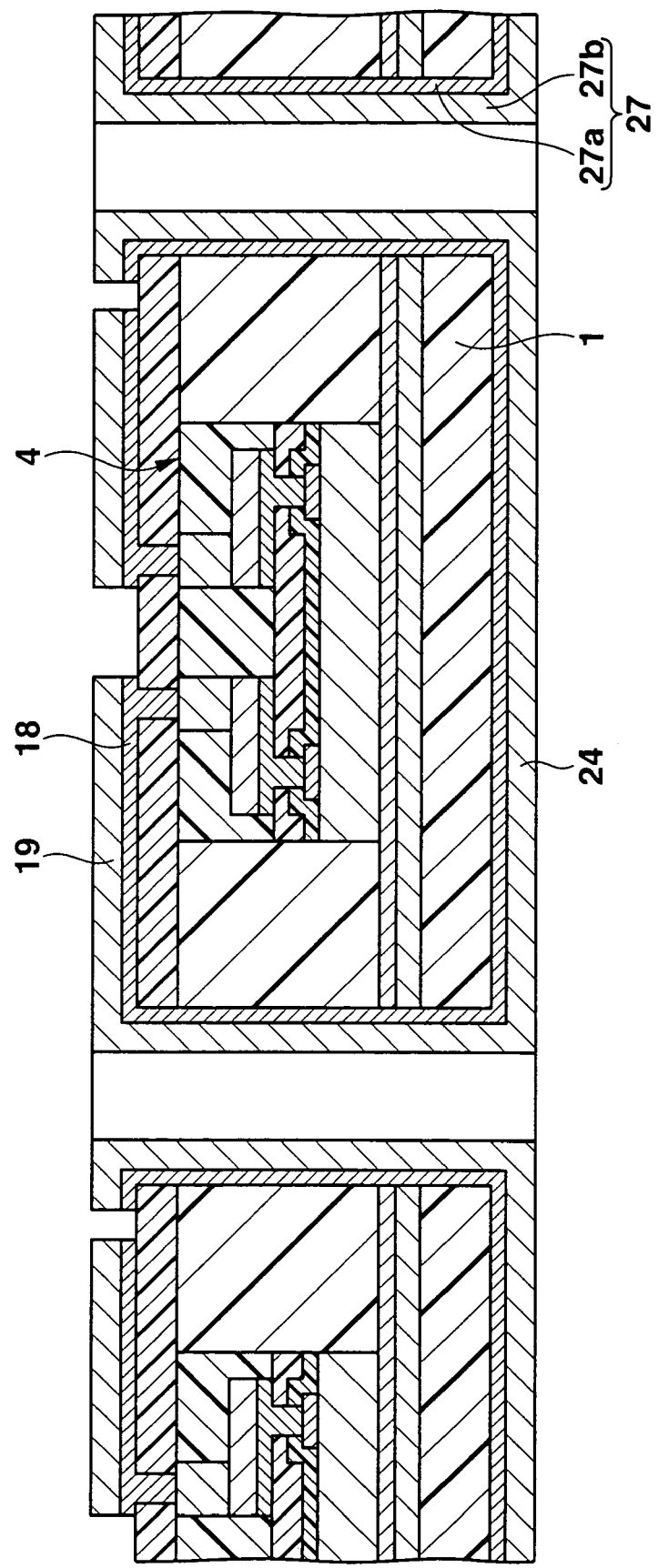
FIG. 16 is a sectional view of the assembly in a step following FIG. 15.

Electroplating of copper is then performed by using the upper metal undercoatings 18, 23, and 27a as plating current paths, thereby forming upper interconnections 19 on the upper surface of the upper metal undercoating 18 in the holes 45 of the plating resist film 44. Also, a lower interconnection 24 is formed on the lower surface of the lower metal undercoating 23, and a copper layer 27b is formed on the surface of the metal undercoating 27a in each through hole 26a. After that, the plating resist film 44 is removed, and unnecessary portions of the upper metal undercoating 18 are etched away by using the upper interconnections 19 as masks. Consequently, as shown in FIG. 16, the upper metal undercoating 18 remains only below the upper interconnections 19. In this state, a cylindrical vertical conducting portion 27 having the metal undercoating 27a and copper layer 27b is formed in each through hole 26a.

Figure 17:
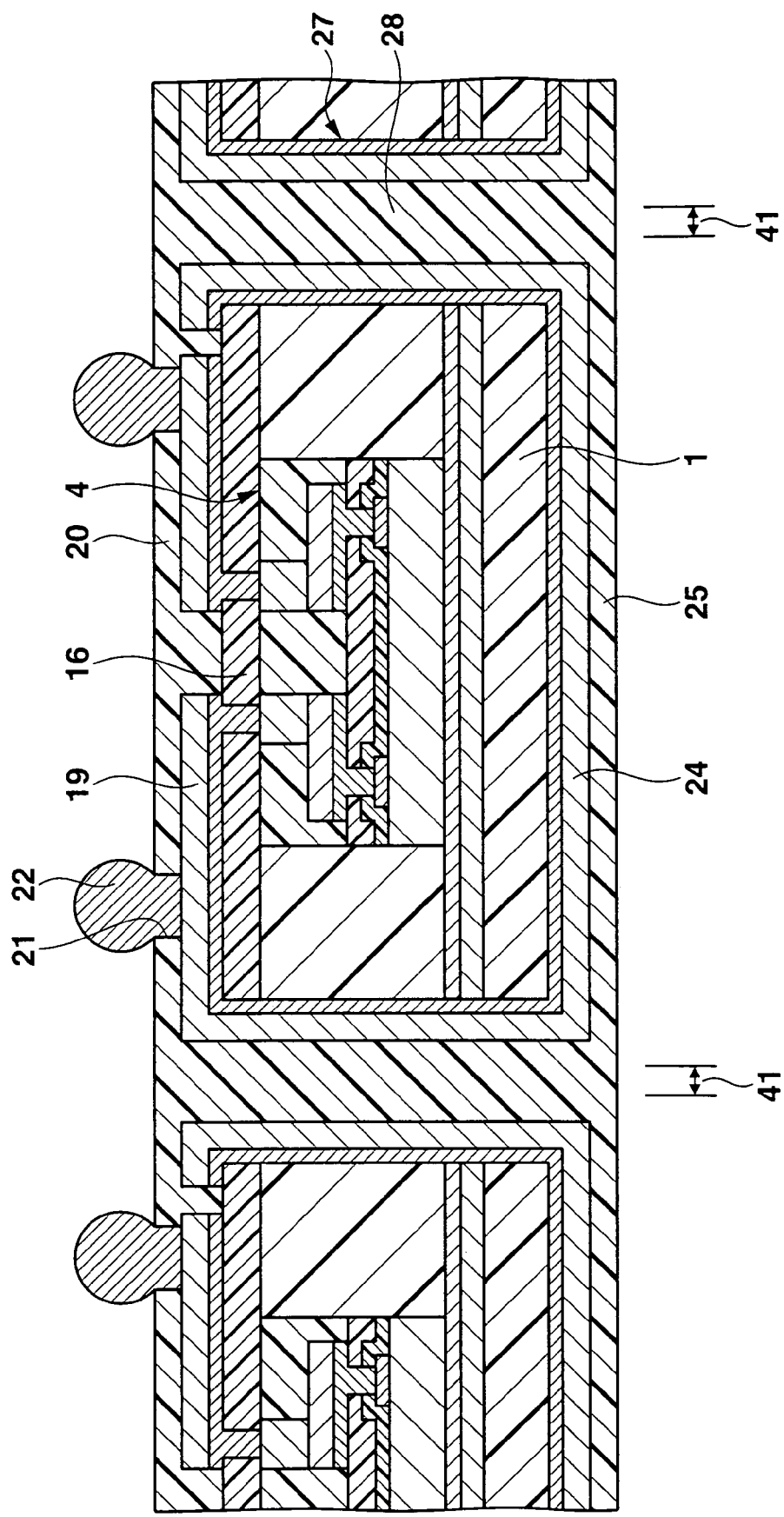
FIG. 17 is a sectional view of the assembly in a step following FIG. 16.

As shown in FIG. 17, an upper overcoat film 20 made of, e.g., a solder resist is formed on the upper surfaces of the upper insulating film 16 and the upper interconnections 19 by, e.g., screen printing. In this case, holes 21 are formed in those portions of the upper overcoat film 20, which correspond to connecting pad portions of the upper interconnections 19. Also, a lower overcoat film 25 made of, e.g., a solder resist is formed on the entire lower surface of the lower interconnection 24. In addition, a side-surface insulating film 28 made of, e.g., a solder resist is formed in each vertical conducting portion 27.

Figure 18:
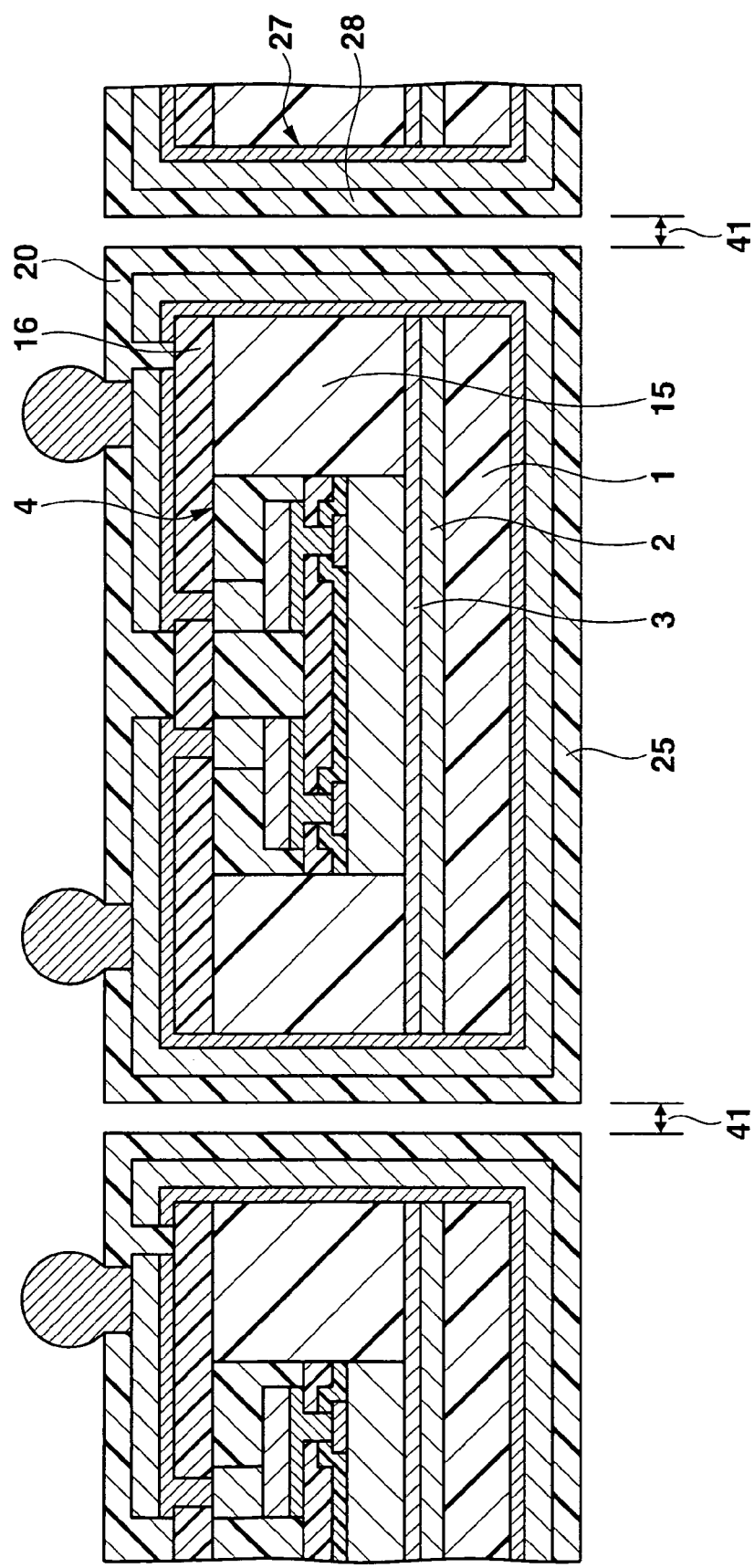
FIG. 18 is a sectional view of the assembly in a step following FIG. 17.
Figure 19:
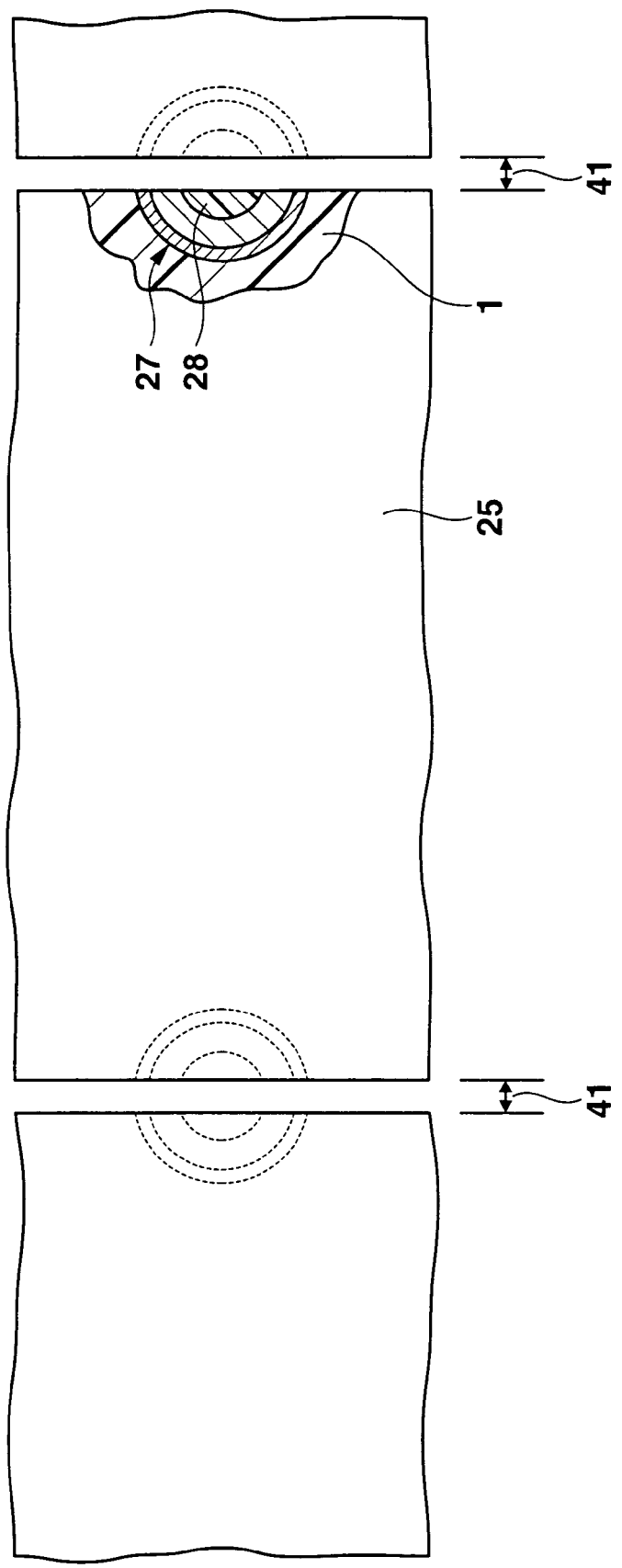
FIG. 19 is a bottom view from which a portion of the assembly in the state shown in FIG. 18 is cut away.

Then, solder balls 22 which are electrically connected to the connecting pad portions of the upper interconnections 19, are formed in and above the holes 21. After that, as shown in FIGS. 18 and 19, the upper overcoat film 20, upper insulating film 16, insulating layer 15, conductive adhesive layer 3, ground layer 2, base plate 1, lower overcoat film 25, vertically extended conducting portions 27, and side-surface insulating film 28 are vertically cut, along the dicing lines 41, in substantially the centers of the surface shapes of the through holes 17 between the semiconductor constructing bodies 4, thereby obtaining a plurality of semiconductor devices one of which is shown in FIG. 1. In this case, the inner wall surfaces of the grooves 26 of the vertical conducting portions 27 continue to the side surfaces of the base plate 1 and insulating film 15 to form the side surfaces around each semiconductor device.

In the fabrication method described above, a plurality of semiconductor constituent bodies 4 are initially arranged on the base plate 1, and the upper interconnections 19, lower interconnection 24, vertical conducting portions 27, and solder balls 22 are collectively formed for the semiconductor constructing bodies 4. After that, the resultant structure is cut to obtain a plurality of semiconductor devices. Accordingly, the fabrication steps can be simplified. Also, from the fabrication step shown in FIG. 12, a plurality of semiconductor constructing bodies 4 can be transferred together with the base plate 1. This also simplifies the fabrication steps.

Second Embodiment

Figure 20:
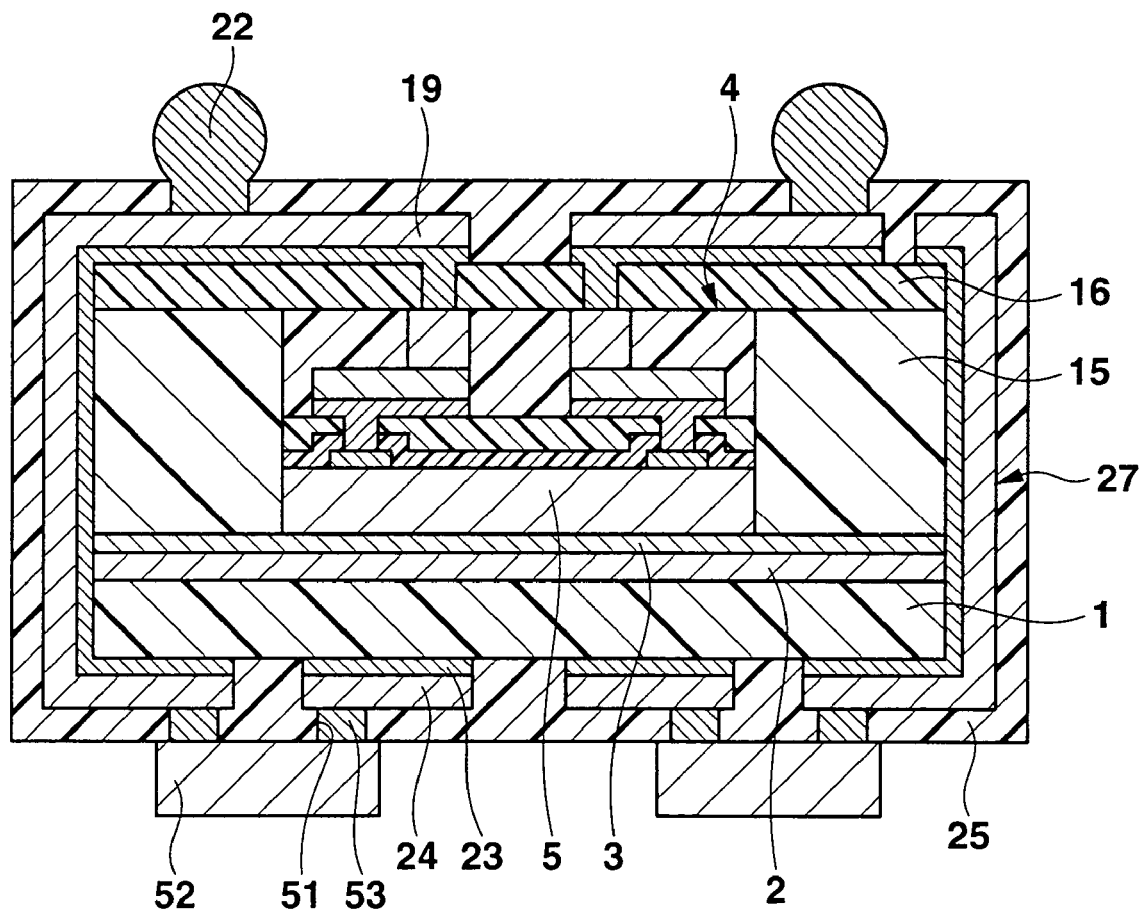
FIG. 20 is a sectional view of a semiconductor device according to the second embodiment of the present invention.

FIG. 20 is a sectional view of a semiconductor device according to the second embodiment of the present invention. This semiconductor device differs from that shown in FIG. 1 in that lower interconnections 24 each including a lower metal undercoating 23 are regular interconnections obtained by patterning, holes 51 are formed in those portions of a lower overcoat film 25, which correspond to connecting pad portions of the lower interconnections 24, and a chip part 52 which is, e.g., a capacitor or resistor is mounted on the connecting pad portions of the lower interconnections 24 via conductive materials 53 made of solder or the like. In this case, the lower interconnections 24 are regular interconnections, so the number of vertical conducting portions 27 for connecting at least portions of the lower interconnections 24 and at least portions of upper interconnections 19 are set in accordance with the number of the lower interconnections 24.

Third Embodiment

Figure 21:
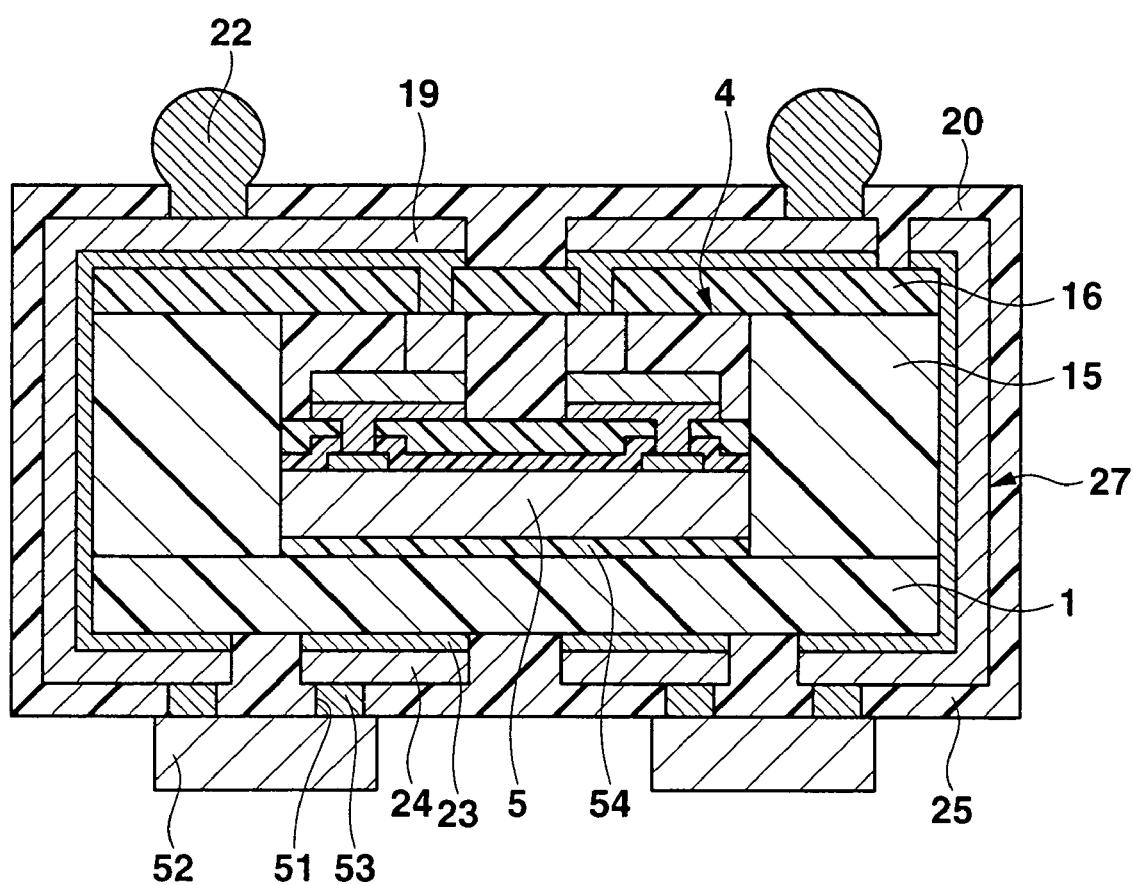
FIG. 21 is a sectional view of a semiconductor device according to the third embodiment of the present invention.

FIG. 21 is a sectional view of a semiconductor device according to the third embodiment of the present invention. A difference from the semiconductor device shown in FIG. 20 is that this semiconductor device has neither a ground layer 2 nor a conductive adhesive layer 3, and the lower surface of a silicon substrate 5 of a semiconductor constructing body 4 is adhered to the upper surface of a base plate 1 via an adhesive layer 54 made of a die bonding material.

Figure 22:
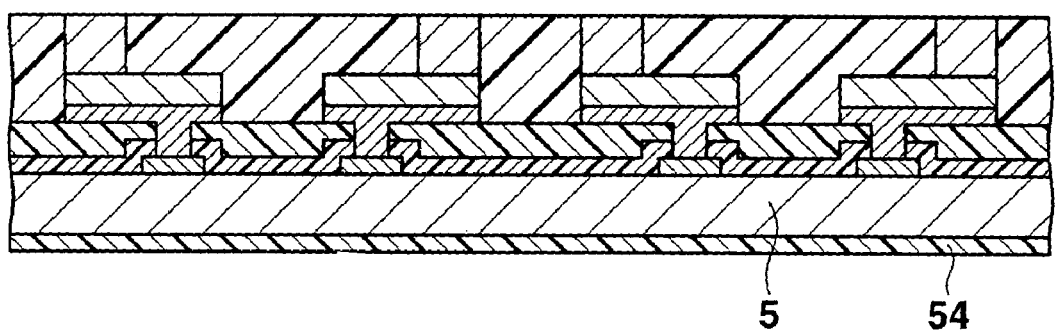
FIG. 22 is a sectional view of an assembly in a predetermined step during the fabrication of the semiconductor device shown in FIG. 21.
Figure 23:
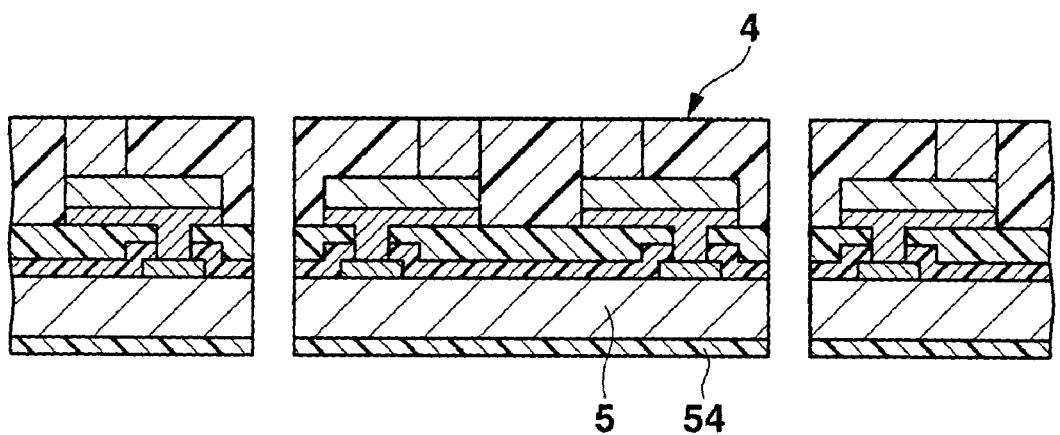
FIG. 23 is a sectional view of the assembly in a step following FIG. 22.

Part of an example of a method of fabricating this semiconductor constructing body will be described below. After the step shown in FIG. 8, as shown in FIG. 21, the adhesive layer 54 is adhered to the entire lower surface of the silicon substrate 5. The adhesive layer 54 is made of a die bonding material such as an epoxy-based resin or polyimide-based resin, and fixed, in a semi-cured state, to the silicon substrate 5 by heating and pressing. Then, the adhesive layer 54 fixed to the silicon substrate 5 is adhered to a dicing tape (not shown), and removed from the dicing tape after a dicing step shown in FIG. 22 is performed. Consequently, a plurality of semiconductor constructing bodies 4 each having the adhesive layer 54 on the lower surface of the silicon substrate 5 are obtained, as shown in FIG. 23.

The semiconductor constructing body 4 thus obtained has the adhesive layer 54 on the lower surface of the silicon substrate 5. This obviates the need for a very cumbersome operation of forming an adhesive layer on the lower surface of the silicon substrate 5 of each semiconductor constructing body 4 after the dicing step. The operation of removing an adhesive layer from the dicing tape after the dicing step is much easier than the operation of forming an adhesive layer on the lower surface of the silicon substrate 5 of each semiconductor constructing body 5 after the dicing step. To fix the semiconductor constructing body 4 on the base plate 1, the adhesive layer 54 need only be finally cured by heating and pressing.

Other Embodiments

In the above embodiments, the through hole 26a of each vertical conducting portion 27 has a circular planar shape formed by laser processing, and the wafer is cut along a cut line which runs trough substantially the center of each circle. However, the planar shape of the through hole 26a is not limited to a circle, but may also be a rectangle, rhombus, or scalene polygon. Also, although the conductive layer is formed by plating on the inner surface of the through hole 26a, conductive paste may also be filled.

Furthermore, in, e.g., FIG. 20, each of the upper interconnections 19 formed on the upper insulating film 16 via the metal layers 18 is made up of a single layer, and each of the lower interconnections 24 formed below the lower insulating film or base via the metal layers 23 is also made of a single layer. However, both upper and lower interconnections 19, 24 may also be made up of two or more laminated layers. Also, an electronic part 52 mounted below the lower overcoat film 25 need not be the chip part described above. For example, it is also possible to mount a bare chip or CSP.

In addition, in the above embodiments, the semiconductor constructing body 4 has the columnar electrodes 13 as external connecting electrodes. However, the semiconductor constructing body 4 may also have interconnections 12 having connecting pad portions as external connecting electrodes, instead of the columnar electrodes, or may also have connecting pads 6 as external connecting electrodes, instead of the columnar electrodes and interconnections.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a base plate having a plurality of peripheral surfaces;
at least one first conductive layer carried by the base plate;
a semiconductor constructing body which is formed above the base plate, and which includes a semiconductor substrate and a plurality of external connecting electrodes carried by the semiconductor substrate;
an insulating layer which is formed above the base plate and around the semiconductor constructing body, and which has a plurality of peripheral surfaces and a same peripheral shape and size as the base plate;
a plurality of second conductive layers which are formed above the insulating layer and which are electrically connected to the external connecting electrodes of the semiconductor constructing body; and
a vertical conducting portion which is formed on at least one of the peripheral surfaces of the insulating layer and on at least one of the peripheral surfaces of the base plate corresponding to said at least one of the peripheral surfaces of the insulating layer, and which electrically connects at least one said first conductive layer and at least one of the second conductive layers.

2. A device according to claim 1, wherein the vertical conducting portion comprises: (i) a groove formed in said at least one of the peripheral surfaces of the insulating layer and in said at least one of the peripheral surfaces of the base plate corresponding to said at least one of the peripheral surfaces of the insulating layer, and (ii) a vertical conducting layer formed in the groove.

3. A device according to claim 2, wherein an inner surface of the groove continues to the peripheral surfaces of the insulating layer and base plate.

4. A device according to claim 2, wherein an inner surface of the groove has a semi-circular planar shape.

5. A device according to claim 1, wherein a ground layer is formed on an upper surface of the base plate and electrically connected to the vertical conducting portion.

6. A device according to claim 5, wherein the semiconductor substrate of the semiconductor constructing body is adhered to the ground layer by a conductive adhesive layer.

7. A device according to claim 1, wherein a ground layer is formed on a lower surface of the base plate and electrically connected to the vertical conducting portion.

8. A device according to claim 1, wherein said at least one first conductive layer is formed on a lower surface of the base plate, and a portion of the first conductive layer is electrically connected to the vertical conducting portion.

9. A device according to claim 8, wherein the first conductive layer comprises a plurality of first conductive layer sections including lowermost conductive layer sections, at least one of the lowermost conductive layer sections has a connecting pad portion, and the lowermost conductive layer sections are covered with a lower overcoat film except for the connecting pad portion of said at least one of the lowermost conductive layer sections.

10. A device according to claim 9, further comprising at least one electronic part formed on a lower surface of the lower overcoat film and electrically connected to at least one said connecting pad portion of the lowermost conductive layer sections of the first conductive layer.

* * * * *